United States Patent
Dias et al.

(10) Patent No.: US 10,909,503 B1
(45) Date of Patent: Feb. 2, 2021

(54) SNAPSHOTS TO TRAIN PREDICTION MODELS AND IMPROVE WORKFLOW EXECUTION

(71) Applicant: EMC IP Holding Company LLC, Hopkinton, MA (US)

(72) Inventors: Jonas F. Dias, Rio de Janiero (BR); Angelo E. M. Ciarlini, Rio de Janiero (BR); Rômulo Teixeira de Abreu Pinho, Niteroi (BR)

(73) Assignee: EMC IP Holding Company LLC, Hopkinton, MA (US)

( * ) Notice: Subject to any disclaimer, the term of this patent is extended or adjusted under 35 U.S.C. 154(b) by 790 days.

(21) Appl. No.: 15/364,449

(22) Filed: Nov. 30, 2016

Related U.S. Application Data

(60) Provisional application No. 62/419,219, filed on Nov. 8, 2016.

(51) Int. Cl.
*G06N 20/00* (2019.01)
*G06Q 10/10* (2012.01)
(Continued)

(52) U.S. Cl.
CPC .......... *G06Q 10/103* (2013.01); *G06F 30/20* (2020.01); *G06N 5/04* (2013.01); *G06N 20/00* (2019.01)

(58) Field of Classification Search
CPC ...... G06Q 10/103; G06N 20/00; G06N 20/10; G06N 20/20
See application file for complete search history.

(56) References Cited

U.S. PATENT DOCUMENTS

| | | | | |
|---|---|---|---|---|
| 5,999,911 A | * | 12/1999 | Berg | ........................ G06F 17/50 705/7.26 |
| 7,885,840 B2 | * | 2/2011 | Sadiq | ............... G06Q 10/06311 |

(Continued)

OTHER PUBLICATIONS

Mandal, Anirban "Adapting Scientific Workflows on Networked Clouds Using Proactive Instrospection", 2015 IEEE/ACM 9th International Conference on Utility and Cloud Computing, Dec. 7-10. pp. 162-173 (Year: 2015).*

(Continued)

*Primary Examiner* — Austin Hicks
(74) *Attorney, Agent, or Firm* — Ryan, Mason & Lewis, LLP

(57) ABSTRACT

Methods and apparatus are provided for taking snapshots to train prediction models and improve workflow execution. An exemplary method for managing execution of a workflow comprising one or more sub-workflows comprises parsing and interpreting a definition of the workflow and the one or more sub-workflows; flattening the workflow and the sub-workflows into a directed acyclic graph where nodes represent activities and edges represent partial-order constraints; collecting provenance data about executions of the workflow according to the directed acyclic graph; taking snapshots of the collected provenance data as a representation of a state of the workflow execution; calculating one or more quality metrics regarding the execution of the workflow; associating the snapshots to the quality metrics; training one or more prediction models of the quality metrics based on the snapshots of the workflow executions; and processing the prediction models during a real-time execution of the workflow to adjust the execution of the workflow. The snapshots are triggered using graph-based and/or time-based triggering techniques.

20 Claims, 8 Drawing Sheets

(51) Int. Cl.
*G06N 5/04* (2006.01)
*G06F 30/20* (2020.01)

(56) References Cited

U.S. PATENT DOCUMENTS

| | | | | |
|---|---|---|---|---|
| 8,700,678 B1* | 4/2014 | Fan | ............. | G06F 11/1415 |
| | | | | 707/803 |
| 2005/0177414 A1* | 8/2005 | Priogin | ............. | G06Q 10/06 |
| | | | | 706/21 |
| 2015/0356485 A1* | 12/2015 | Aggour | ............. | G06Q 10/06316 |
| | | | | 705/7.26 |
| 2016/0103706 A1* | 4/2016 | Novaes | ............. | G06F 9/4881 |
| | | | | 718/102 |

OTHER PUBLICATIONS

Mandal, Anirban "Adapting Scientific Workflows on Networked Clouds Using Proactive Instrospection", 2015 IEEE/ACM 9th International Conference on Utility and Cloud Computing, Dec. 7-10. pp. 162-173 (Year: 2015).*

Codish et al., "Solving Partial Order Constraints for LPO Termination", in International Conference on Rewriting Techniques and Applications, pp. 4-18, Springer Berlin Heidelberg (Aug. 2006).

Lebo et al., "PROV-O: The PROV Ontology", Apr. 30, 2013, W3C Recommendation. URL: http://www.w3.org/TR/2013/REC-prov-o-20130430/.

Ciarlini et al., "Method and Apparatus for Analytical Processing of Provenance Data for HPC Workflow Optimization" U.S. Appl. No. 14/580,732, filed Dec. 23, 2014.

* cited by examiner

GRAPH-BASED TRIGGERING 500

ADJACENCY MATRIX 510

TIME-BASED TRIGGERING 550

SNAPSHOTS TO TRAIN PREDICTION MODELS AND IMPROVE WORKFLOW EXECUTION

CROSS-REFERENCE TO RELATED APPLICATIONS

The present application claims priority to U.S. Provisional Patent Application Ser. No. 62/419,219, filed Nov. 8, 2016, entitled "Snapshots to Train Prediction Models and Improve Workflow Execution," incorporated by reference herein.

FIELD

The field relates generally to managing execution of a workflow in a workflow environment.

BACKGROUND

Business processes specification is an important step towards quality assurance in service offerings and product development. Business processes can be described as chains of activities, which are commonly known as workflows (Wf). Several of such activities represent a complete experimental process, which is often called a scientific workflow (SWf). Parts of the SWf may trigger computer programs or scripts that call a sequence of computer programs. In this sense, there are several sub-workflows inside the Wf. Representing processes as workflows is a well-known approach to make such processes reproducible and reliable. It also allows for keeping track of the produced assets and the provenance of such assets. However, many types of workflows exist at different levels of abstraction and are usually treated as distinct items.

After business processes are specified as workflows, the business processes are often optimized. In order to optimize the execution of a process, it is important to have a detailed understanding of the process. If the processes are interpreted as distinct items, it is hard to achieve a global optimization, across workflows. For instance, consider that scientific workflows are optimized to achieve better quality, potentially making them more expensive (e.g., taking more time to complete their execution). When there is a sudden need to run a higher-level business workflow as fast as possible, the scientific workflows that are called by this business workflow might hinder the performance of the business workflow. Nevertheless, if the optimizer knows the business workflow with a finer granularity, it might be able to adjust execution parameters to achieve the higher-level goals.

U.S. patent application Ser. No. 14/580,732, filed Dec. 23, 2014 (now U.S. Pat. No. 10,013,656), entitled "Method and Apparatus for Analytical Processing of Provenance Data for HPC Workflow Optimization," incorporated by reference herein, addresses the need for a global optimization in which the input data sets are taken into account and an optimization goal can vary. In one or more embodiments, data provenance is collected, describing the execution of the various workflow tasks and the corresponding dataflow with features of input and output data sets of each task. Based on the collected provenance data, local prediction models for each task are created and global prediction models are generated based on their combination to enable the selection of the best alternatives for workflow execution.

A need remains for improved techniques for managing execution of a workflow comprising one or more interrelated sub-workflows, taking into account the flow of data between sub-workflows.

SUMMARY

Illustrative embodiments of the present invention provide methods and apparatus for taking snapshots to train prediction models and improve workflow execution. In one exemplary embodiment, a method for managing execution of a workflow comprising one or more sub-workflows comprises the steps of: parsing and interpreting a definition of the workflow and the one or more sub-workflows; flattening the workflow and the one or more sub-workflows into a directed acyclic graph where nodes represent activities and edges represent partial-order constraints; collecting provenance data about one or more executions of the workflow according to the directed acyclic graph, wherein the collected provenance data comprises one or more of a description of a status of the activities, an assignment of resources to the activities, features of input data sets and intermediate data sets and metrics about the execution of one or more of the activities; taking one or more snapshots of the collected provenance data as a representation of a state of the workflow execution; calculating one or more quality metrics regarding the execution of the workflow; associating the one or more snapshots to the one or more quality metrics; training one or more prediction models of the quality metrics using machine learning techniques based on the one or more snapshots of a plurality of the workflow executions; and processing the one or more prediction models during a real-time execution of the workflow to adjust the execution of the workflow, by updating one or more of parameters of the workflow and a resource allocation of the workflow, taking into account one or more of the quality metrics predicted by the one or more prediction models.

In one or more embodiments, the snapshots comprise information from the workflow and any additional workflows that share resources with the workflow. In at least one embodiment, the snapshots are triggered when a given execution crosses one or more elements of the directed acyclic graph that are marked with a predefined flag, or at a specified time interval during a given execution. The snapshots included in the training of prediction models optionally comprise snapshots taken during the executions of the workflow and additional snapshots generated after a completion of the workflow executions.

In at least one exemplary embodiment, the prediction models are updated substantially continuously as more provenance data about new executions are collected.

Advantageously, illustrative embodiments of the invention provide improved techniques for managing execution of a workflow. These and other features and advantages of the present invention will become more readily apparent from the accompanying drawings and the following detailed description.

DETAILED DESCRIPTION

Illustrative embodiments of the present invention will be described herein with reference to exemplary communication, storage and processing devices. It is to be appreciated, however, that the invention is not restricted to use with the particular illustrative configurations shown. Aspects of the invention provide methods and apparatus for managing execution of a workflow comprising one or more sub-workflows. One or more embodiments of the present invention employ snapshots to train prediction models and improve workflow execution.

As noted above, U.S. patent application Ser. No. 14/580, 732, filed Dec. 23, 2014 (now U.S. Pat. No. 10,013,656), entitled "Method and Apparatus for Analytical Processing of Provenance Data for HPC Workflow Optimization," incorporated by reference herein, addresses the need for a global optimization in which the input data sets to be treated are taken into account and the optimization goal can vary.

Another issue associated with workflow optimization is its dynamic adaptation. During the execution of a business process, the intermediary outcome may be different from what was originally predicted. Consequently, the decisions made by the optimizer will no longer be the best decisions. In this sense, the execution manager should find the new best execution plan and adapt the resources dynamically. To accomplish such a goal, the optimizer needs a prediction tool that gives accurate predictions for the outcome of the whole workflow, including the sub-workflows, at different execution steps.

In one or more embodiments of the present invention, the hierarchy of workflows is represented as a single directed acyclic graph (DAG). When a user submits a workflow to run, the system accesses the definition of the workflow and the sub-workflows of the workflow and flattens them into a single DAG that connects activities of the sub-workflows based on partial-order constraints. See, for example, M. Codish et al., "Solving Partial Order Constraints for LPO Termination," Int'l Conf. on Rewriting Techniques and Applications, 4-18 (August 2006; Springer Berlin Heidelberg), incorporated by reference herein in its entirety.

Figure 1:
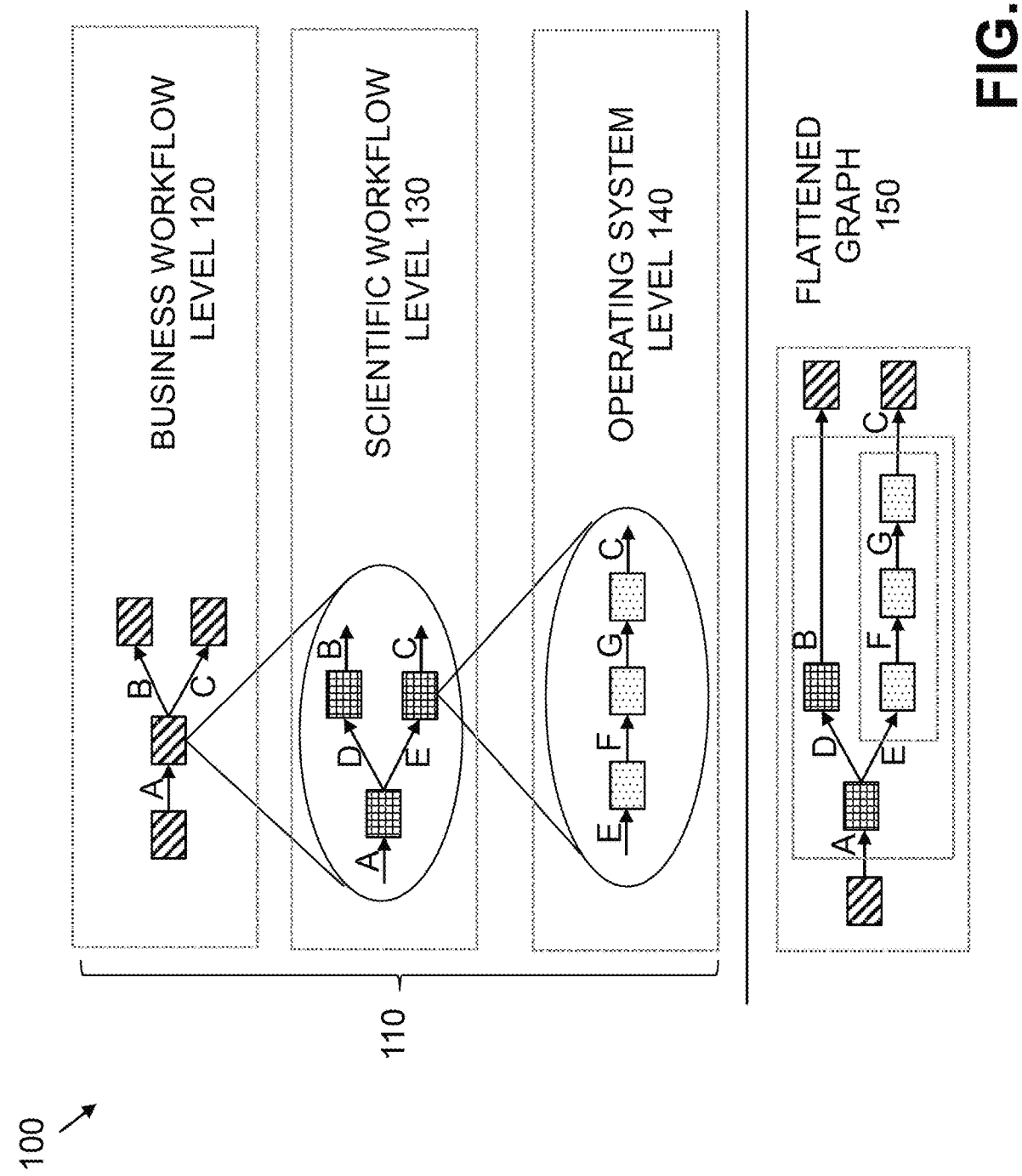
FIG. 1 illustrates a process for flattening a workflow as a single directed acyclic graph, according to an embodiment of the invention.

FIG. 1 illustrates a flattening process 100 for flattening of a workflow 110 as a single DAG, according to an embodiment of the invention. As shown in FIG. 1, the exemplary workflow 110 comprises a business workflow level 120, a scientific workflow level 130 and an operating system level 140. The flattening process 100 generates a flattened graph 150 for the workflow 110. Prior to the execution of the workflow 110, the flattened graph 150 contains only the definition of the workflow 110, i.e., the information known a priori. The flattened graph 150 includes the set of activities, relationships, scripts and input resources, such as parameters and input files, for the specific workflow 110. As the workflow 110 runs, new information, such as obtained results and provenance data, is produced and collected. As the workflow 110 progresses towards its completion, richer information with respect to execution of the workflow 110 becomes available. Finally, the results are produced and quality metrics (Q) are computed and associated to the specific flattened graph 150.

Provenance data about the workflow execution can also include telemetry data about the execution obtained by monitoring the infrastructure, including, for instance, CPU (central processing unit) and memory usage at different points in time.

One or more embodiments of the present invention also consider the possibility of executing various business workflows at the same time, sharing the same infrastructure. In this case, each business workflow corresponds to a different DAG, but the provenance data for a given business workflow includes data about its execution, telemetry data and data about the execution of the other workflows being executed at the same time as the given business workflow. This can be important, since the simultaneous execution of concurrent workflows may influence the final outcome of each workflow, and, in particular, their performance.

Provenance Collection

The provenance data related to the flattened workflow graph 150 generates an extended graph, namely a provenance graph, which can represented using the W3C (World Wide Web Consortium) PROV standard. See, for example, Timothy Lebo et al., eds., "PROV-O: The PROV Ontology," W3C Recommendation, (30 Apr. 2013), incorporated by reference herein in its entirety.

Figure 2:
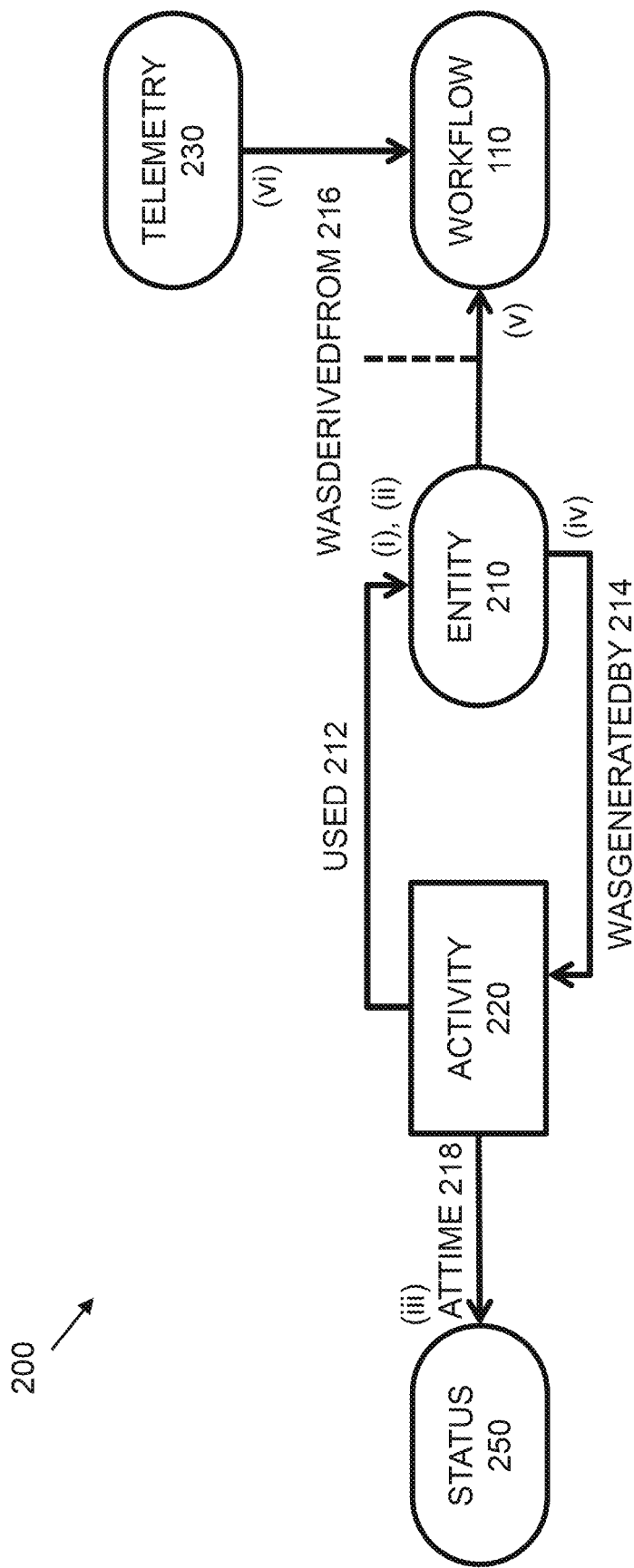
FIG. 2 illustrates relationships between elements in a provenance graph for a workflow, according to one embodiment of the invention.

FIG. 2 illustrates the relationships between elements in a provenance graph 200 for a workflow 110, according to one embodiment of the invention. The vertices of the provenance graph 200 are entities 210 or activities 220. Entities are input, intermediate and output data in the workflow 110. Entities 210 can also be associated with abstract concepts, such as the workflow itself, telemetry registries, status of activities and computer resources, such as processors and allocated memory. Activities 220 are computer programs or human-made processes that create or transform data. Activities 220 and entities 210 are related through a consumer-producer interface. Using the PROV terminology, activities use entities (used relationship 212) and entities are generated by activities (wasGeneratedBy relationship 214). Entities 210 can be derived (wasDerivedFrom relationship 216) from other entities 210, for instance, the telemetry data 230 can be derived from a workflow execution. In one possible embodiment of the invention, an entity 210 is created to represent the workflow execution as a whole and a related entity 210 to represent its telemetry data 230. Besides the telemetry data 230, the entities 210 of the graph are derived from the workflow execution entity.

Activities 220 of a workflow 110 are executed using a specific set of entities 210, which includes the input dataset and execution parameters. Besides, activities 220 get to specific statuses 250 at specific time instants (atTime relationship 218). For instance, an activity gets a 'running' status at a given timestamp to indicate that it has started its execution at that time. In one or more embodiments, the (i) input data, (ii) parameters, (iii) status, (iv) output data, (v) workflow execution, and (vi) telemetry data are represented as entities. However, these listed elements are stored using different semantics, as shown in FIG. 2.

An important concept of various embodiments of the present invention corresponds to the snapshots of the execution of a workflow at a specific time within a specific context. Snapshots can be defined in at least one of the embodiments of the present invention, as discussed further below.

Consider that A is the set of all known types of activities, D is the set of all known entities and E is the set of all known status types (e.g., pending, running and done). A workflow definition contains a list of activities, each of type $a_i \in A$. The function (1) occurs($a_i$,w) indicates how many times an activity of type $a_i$ occurs in a workflow w. Another function (2) getStatus($a_i$, w, $e_k$, t) indicates how many activities of type $a_i$ in workflow w have the status $e_k \in E$, at a given timestamp t.

For example, the division getStatus($a_i$, w, 'Finished', t)/occurs ($a_i$, w) indicates the ratio of activities of type $a_i$ that have finished their execution by time t. A third function (3) entityValue($\alpha$, w, $d_k$) indicates the value (or property) of an entity $d_k \in D$ that a specific instance a of an activity of the workflow w is using. A fourth function (4) timeWithStatus ($\alpha$, w, $e_k$) indicates for how long a specific instance a of an activity of the workflow w remained with the status $e_k$. A fifth function (5) summary([$v_1, v_2, \ldots, v_n$]) returns a fixed set of statistical metrics (e.g. mean, standard deviation, percentiles, minimum and maximum values) about the list of values [$v_1, v_2, \ldots, v_n$] related either to entities or activities. A sixth function (6) sum([$v_1, v_2, \ldots, v_n$]) returns the sum of a list of values. A seventh function (7) telemetryValues(w, t) returns a list containing the values at time t for the telemetry metrics available on the infrastructure where the workflow is running.

Given the aforementioned definitions, the snapshot, S(w, t), of the workflow w, at a timestamp t, which is currently running an instance a of an activity $a_i \in A$, is the juxtaposition, for each $a_i \in A$, for each $e_k \in E$, and for each $d_k \in D$, of the following results:

$$S(w, t) = \begin{bmatrix} \text{list of } occurs(a_i, w) \text{ for all } a_i, \\ \text{list of } getStatus(a_i, w, e_k, t)/occurs(a_i, w) \text{ for all } a_i, \text{ for all } e_k \\ \text{list of } summary(\text{list of } entityValue(a_i, w, d_k) \text{ for all } a_i) \\ \text{for all } d_k, \\ \text{list } summary(\text{list of } timeWithStatus(a_i, w, e_k) \text{ for all } a_i) \\ \text{for all } e_k, \\ \text{list of } entityValue(\alpha, w, d_k) \text{ for all } d_k \text{ for all running activities } \alpha, \\ \text{list of } timeWithStatus(\alpha, w', running) \text{ for all running activities } \alpha, \\ telemetryValues(w, t) \end{bmatrix}$$

In one or more embodiments, the snapshots give a general view of the global state, showing summarized methods of how the activities of the workflow have progressed so far. The exemplary snapshots also give detailed information about the currently running instances of activities $\alpha$.

Figure 3:
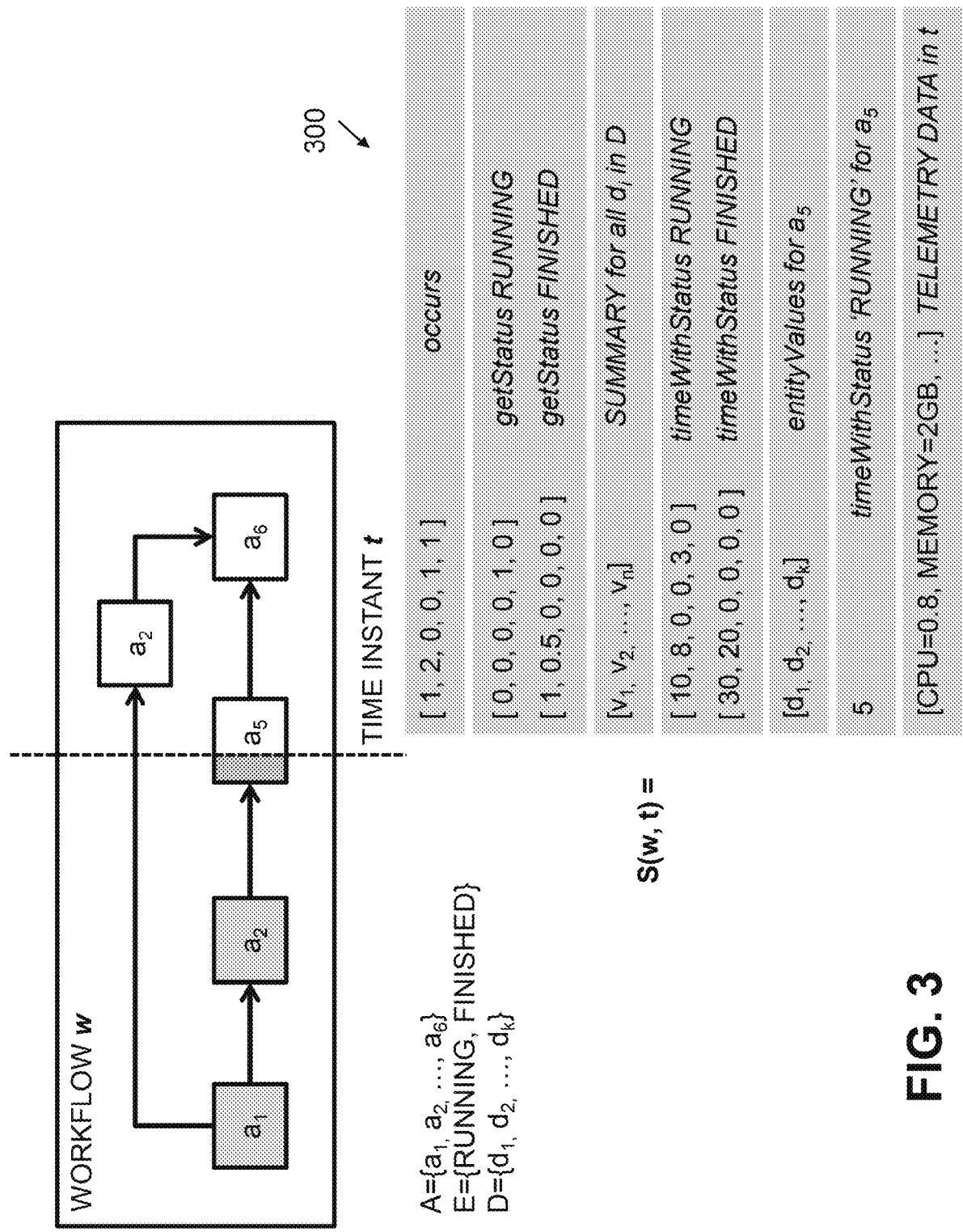
FIG. 3 shows an example of a snapshot for a workflow w in a time instant t, according to one embodiment of the invention.

FIG. 3 shows an example of a snapshot 300 for a workflow w in a time instant t, according to one embodiment of the invention. Reading the snapshot 300, it is possible to check that activities of type $a_2$ occur twice in the workflow w. It is also possible to check that an activity of type $a_5$ is running, an activity of type $a_1$ has finished and 50% of the activities of type $a_2$ in the workflow have finished. It is also possible to check the average execution time for every activity in the workflow. For the currently running activity of type $a_5$, it is possible to check the used values for the entities in D as well as the time spent on each state.

Although a snapshot 300 contains information about a specific workflow w, if the workflow w shares resources with other workflows, the snapshot 300 can optionally be extended to include information related to the other workflow instances being executed. In one of the possible embodiments of the present invention, the snapshot 300 of each workflow w, comprises the following information:

list of summary(list of entityValue($a_i$, $w_j$, $d_k$) for all $a_i$, for all $w_j \neq w$) for all $d_k$
    list of (sum of getStatus($a_i$, $w_j$, 'running', t) for all $w_j \neq w$) for all $a_i$ The first list represents a summary of the features of the other running workflows and the second list represents a consolidation of which type of activities are currently running in the other workflows.

Quality Metrics

After the execution of a workflow, it is also possible to extract quality metrics based on provenance data and the results of the workflow. For instance, the total execution time can be used as a quality metric and the total execution time can be obtained by querying the statuses recorded for the activities of the workflow. An arbitrary performance indicator can also be computed reading the output file of a workflow, which is referenced in the entity set D. Alternatively, the monetary cost of the workflow execution can be computed as a quality metric. Even a combination (or a weighted sum) of these examples is a candidate to be a quality metric. Thus, a generic quality metric function Q(w, t) is assumed to compute a quality metric for the workflow w at a time instant t based on available provenance data for the workflow w.

After the execution of a workflow, there are several snapshots S(w, $t_i$), i={1, 2 . . . , n} and several quality metrics measurements Q(w, $t_j$), j={1, 2 . . . , m} computed for that workflow execution. One may associate a snapshot i to a quality metric measurement j or associate several snapshots to a single quality metric measurement j.

Although a generic framework is disclosed to compute snapshots 300 and quality metrics, the number of collected snapshots 300 and quality metric measurements are usually correlated. For instance, if the time to complete the workflow execution is the quality metric, there will be one measurement for each workflow snapshot. Alternatively, if the quality metric is the accuracy of the workflow results, the snapshots may be associated to a single quality metric measurement. For the sake of notation simplicity, $S_i$ indicates a snapshot S(w, $t_i$), i={1, 2 . . . , n} and $Q_j$ as a quality metric Q(w, $t_j$), j={1, 2 . . . , m}.

The pairs ($S_i$, $Q_j$) can be used as a source to train prediction models using machine learning tools, as would be apparent to those skilled in the art. Typically, multiple snapshots of multiple executions are collected and used to create prediction models. Such models aim to infer future values of the quality metrics based on information associated with a snapshot in the present. This is especially useful to make predictions based on partial results. The closer a snapshot is to the end of the execution of the workflow, the more accurate tends to be the prediction.

Figure 4:
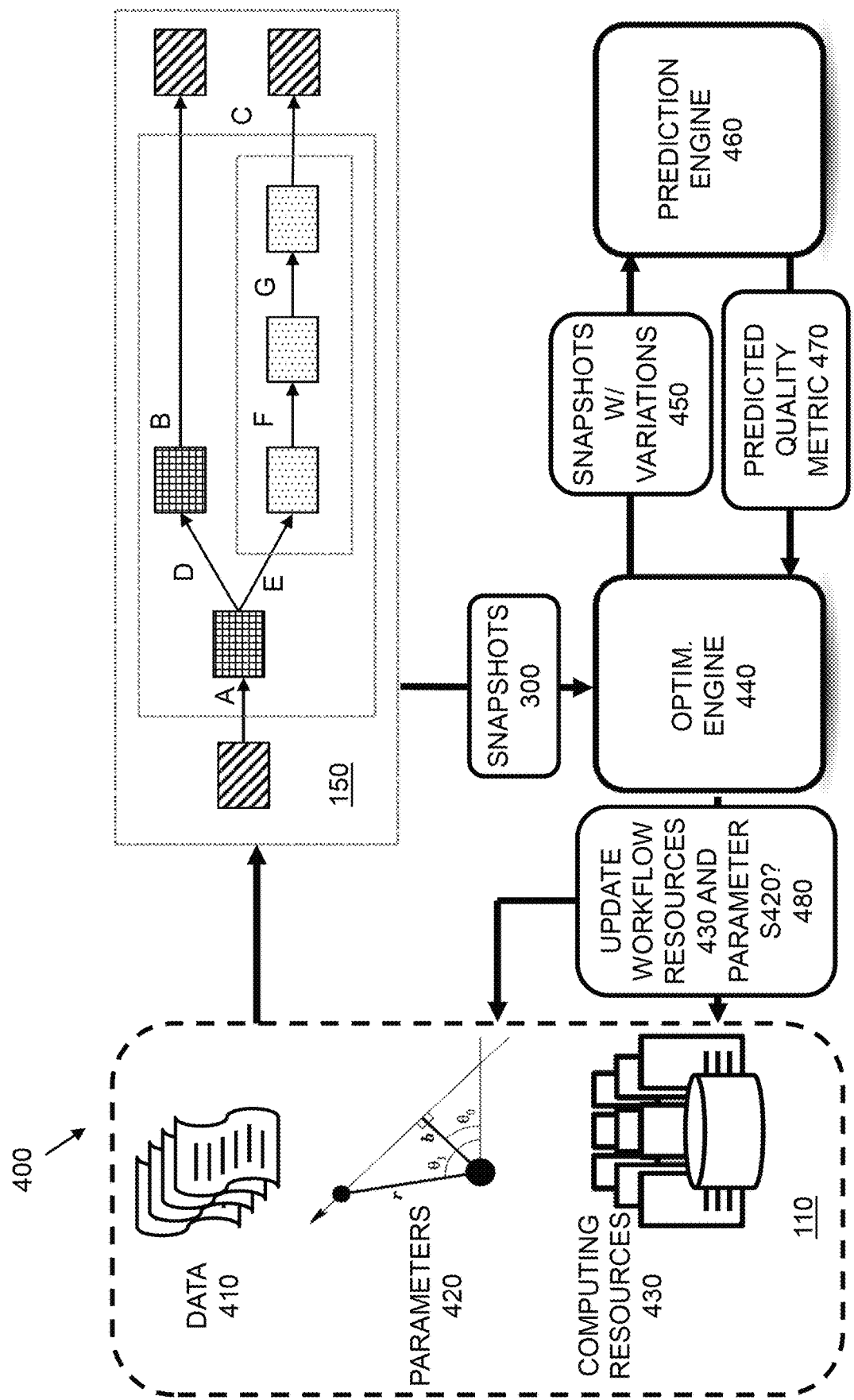
FIG. 4 illustrates a workflow optimization process based on one or more predicted quality metrics, in accordance with one embodiment of the invention.

When prediction models for a whole workflow are available, the prediction models are used in real-time to optimize new executions of that workflow. From time to time, snapshots 300 of the current execution are taken and the expected quality metrics are evaluated by means of the prediction model. FIG. 4 illustrates a workflow optimization process 400 based on the predicted quality metrics, in accordance with one embodiment of the invention. As shown in FIG. 4, a workflow 110 comprises data 410, parameters 420 and one or more computing resources 430. The flattening process 100 of FIG. 1 generates a flattened graph 150 for the workflow 110. Snapshots 300 are captured for the workflow 110 at various time instants.

An optimization engine 440 processes the snapshots 300 to determine whether one or more of the parameters 420 and computing resources 430 of the workflow 110 should be updated at stage 480, as discussed below. In addition, optimization engine 440 provides the snapshots with proposed variations 450 of the parameters 420 and/or computing resources 430 of the workflow 110 to a prediction engine 460 that employs machine learning techniques. The prediction engine 460 generates one or more predicted quality metrics 470 that are provided to the optimization engine 440.

If the predicted quality metrics 470 do not meet an acceptance criteria, the optimization engine 440 searches for new possibilities, varying an allocation of the resources 430 and/or tunable parameters 420 in the snapshots 300. The optimization engine 440 re-evaluates the candidates using the prediction model of the prediction engine 460. If an updated snapshot 300 obtains better performance, the parameters 420 and/or the allocation of the resources 430 can be changed to optimize the results, as shown in FIG. 4.

Snapshot Triggering

Figure 5A:
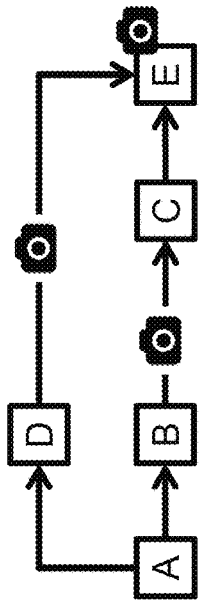
FIGS. 5A and 5B illustrate graph-based triggering and time-based triggering, respectively, of snapshots, according to one embodiment of the invention.
Figure 5A:
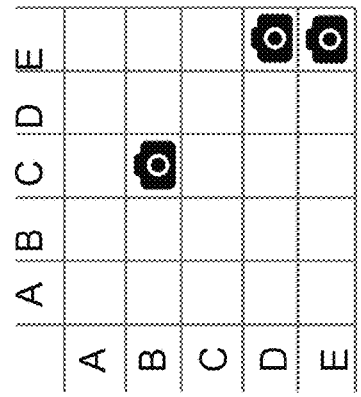

Taking a snapshot 300 during the execution of a workflow 110 may be costly. A snapshot 300 can be triggered based on one or more of the following possibilities: (a) graph-based triggering; and (b) time-based triggering. FIG. 5A illustrates graph-based triggering 500 of snapshots 300, according to one embodiment of the invention. For the graph-based triggering shown in FIG. 5A, when the execution of the workflow 110 crosses a predefined edge (or a node) of the flattened graph 150, a snapshot 300 capture is triggered. This "trap system" can be implemented with flags in an adjacency matrix 510, as shown in the example of FIG. 5A. If the edge (or the node) is marked with the trap flag (e.g., the camera icon in the exemplary notation of FIG. 5A), a snapshot 300 capture is triggered.

Figure 5B:
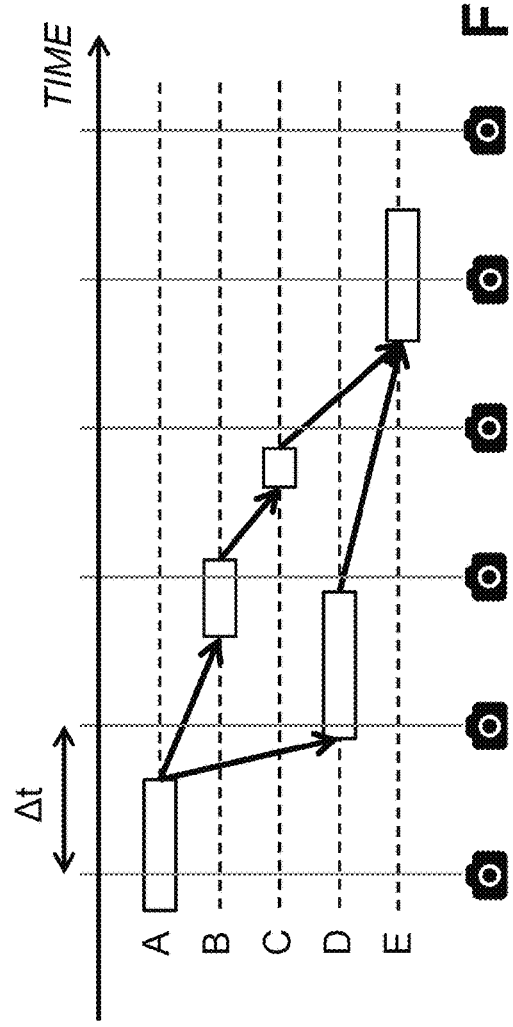

FIG. 5B illustrates time-based triggering 550 of snapshots 300, according to one embodiment of the invention. For the time-based triggering shown in FIG. 5B, a time interval (Δt) is fixed to determine the frequency of snapshots 300 over time. Both aforementioned strategies are independent and can optionally be combined.

In addition, it is important to notice that it is not necessary to generate all the snapshots 300 during the execution. If necessary, additional snapshots 300 can be generated afterwards and used in the training process.

Continuous Model Refinement

One or more aspects of the invention recognize that the collection of snapshots 300 taken during the execution of the workflows 110 by workflow management settings is a powerful source for the construction of prediction models for the quality metrics presented above. As the workflow management settings evolve, however, new workflows 110 may be created and existing ones may be modified. Such changes eventually modify the concurrency of workflow tasks and their resource allocation and usage patterns. Ultimately, changes in workflow execution result in the prediction models being less accurate.

For these reasons, provenance data must be collected in one or more embodiments, at substantially all times, so that the prediction models can be updated and refined substantially continuously. In practice, a measure of prediction accuracy can optionally be calculated at the end of every workflow execution. Every execution is thus a source of new information about how to optimize the workflow. Whenever the prediction accuracy falls below a certain threshold, the prediction model can be retrained with the provenance data collected since the last time the model was trained, plus all historical data, as discussed further below in conjunction with FIG. 6. This will potentially improve the model, making it adapt to any new workflow management setting.

Figure 6:
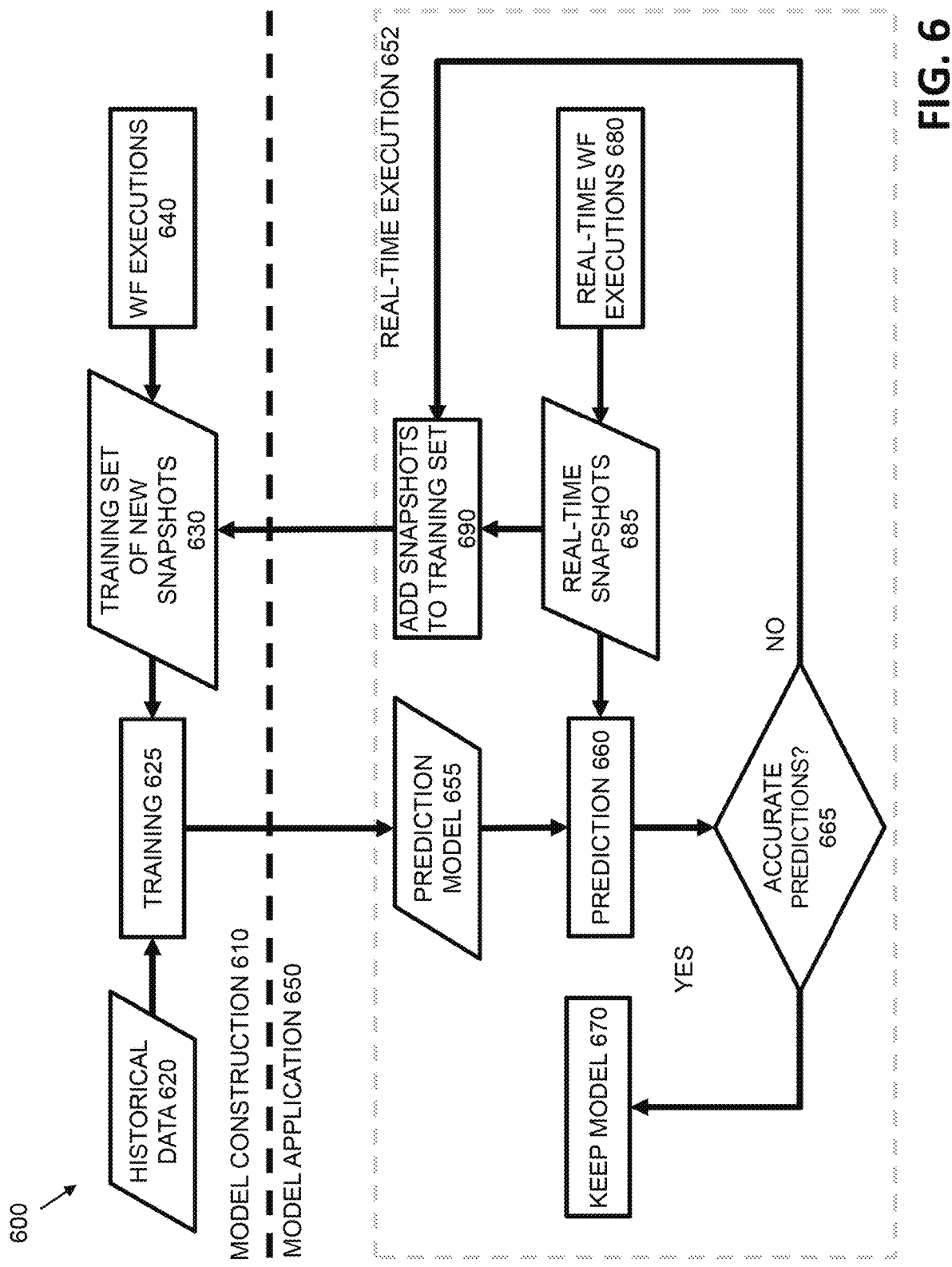
FIG. 6 illustrates an exemplary prediction model adjustment process that performs substantially continuous model refinement, in accordance with one embodiment of the invention.

FIG. 6 illustrates an exemplary prediction model adjustment process 600 that performs substantially continuous model refinement, in accordance with one embodiment of the invention. As shown in FIG. 6, the exemplary prediction model adjustment process 600 has a model construction phase 610 and a model application phase 650, that is used for real-time execution 652 of one or more workflows.

As shown in FIG. 6, during the model construction phase 610, one or more workflows are executed during step 640 to generate a training set of new snapshots 300 during step 630. In addition, historical data 620 is optionally processed as well, comprising additional snapshots 300.

The training and/or historical snapshots 300 are processed during a training step 625 to generate one or more prediction models 655. During the model application phase 650, the prediction models 655 are processed during a prediction step 660 to generate one or more predictions. In addition, during the model application phase 650, one or more workflows are executed in real-time during step 680 to generate a set of real-time snapshots 300 during step 685, that are also processed during the prediction step 660, and added to the training set during step 690.

A test is performed during step 665 to determine if the generated predictions are sufficiently accurate, according to one or more predefined criteria. If it is determined during step 665 that the generated predictions are sufficiently accurate, then the prediction model(s) 655 are kept during step 670. If, however, it is determined during step 665 that the generated predictions are not sufficiently accurate, then the snapshots 300 are added to the training set during step 690. In this manner, the training step 625 can process the additional snapshots 300 that impaired the accuracy of the prediction model 655, to update the model 655.

CONCLUSION

One or more embodiments of the present invention provide techniques for managing execution of a workflow comprising one or more sub-workflows. In one or more embodiments, the hierarchy of workflows is represented as a single directed acyclic graph that connects activities of the sub-workflows based on partial-order constraints. In at least one embodiment, snapshots are used to train prediction models and to improve workflow execution. The possibility of executing various business workflows at the same time, sharing the same infrastructure, is optionally taken into account. In this case, the provenance data for a given business workflow includes data about its execution, telemetry data and data about the execution of the other workflows being executed at the same time and sharing one or more resources as the given business workflow. The collected provenance data is optionally employed to update and refine prediction models over time.

The foregoing applications and associated embodiments should be considered as illustrative only, and numerous other embodiments can be configured using the techniques disclosed herein, in a wide variety of different applications.

It should also be understood that the disclosed techniques for managing execution of a workflow, as described herein, can be implemented at least in part in the form of one or more software programs stored in memory and executed by a processor of a processing device such as a computer. As mentioned previously, a memory or other storage device having such program code embodied therein is an example of what is more generally referred to herein as a "computer program product."

The disclosed techniques for managing execution of a workflow may be implemented using one or more processing platforms. One or more of the processing modules or other components may therefore each run on a computer, storage device or other processing platform element. A given such element may be viewed as an example of what is more generally referred to herein as a "processing device."

Figure 7:
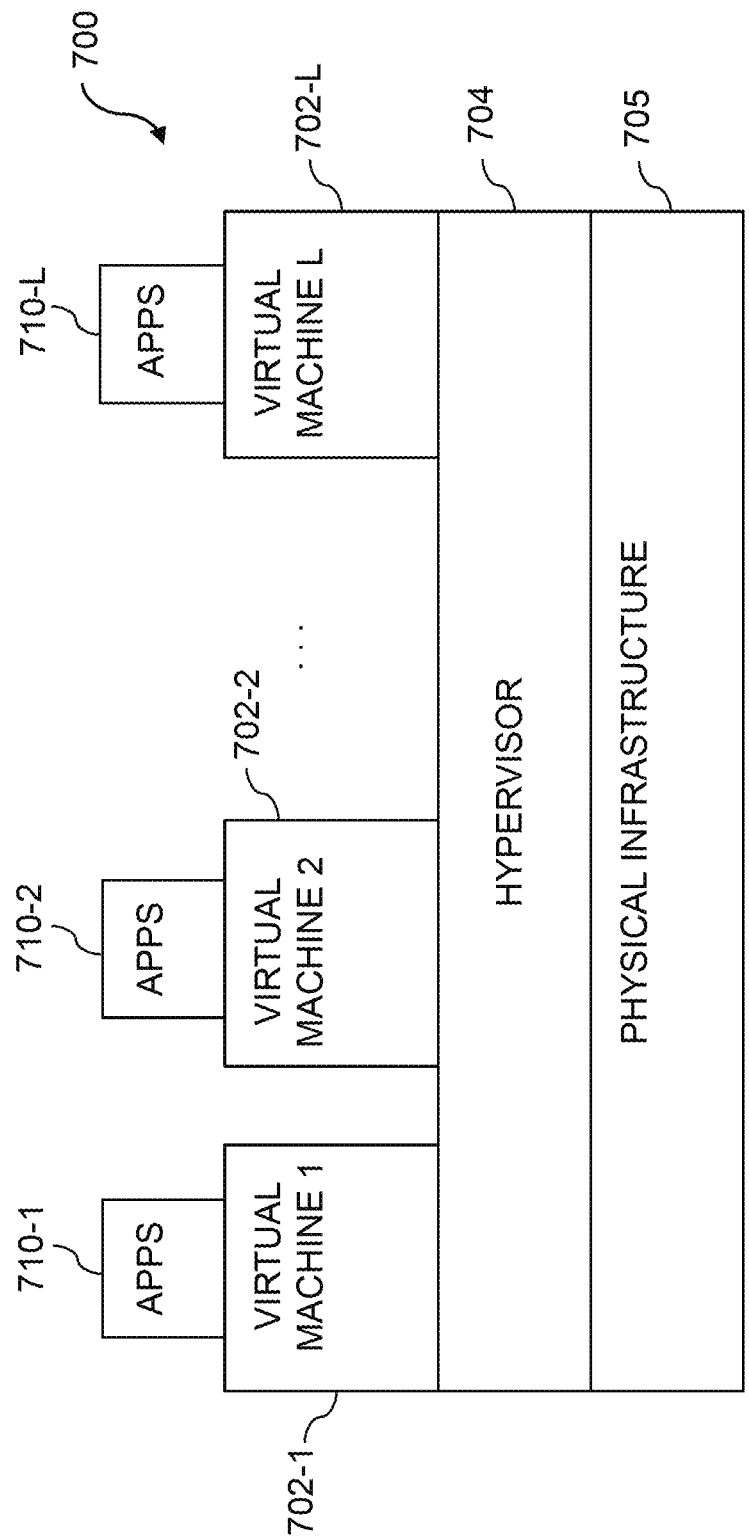
FIG. 7 illustrates an exemplary processing platform that may be used to implement at least a portion of one or more embodiments of the invention comprising a cloud infrastructure.

Referring now to FIG. 7, one possible processing platform that may be used to implement at least a portion of one or more embodiments of the invention comprises cloud infrastructure 700. The cloud infrastructure 700 in this exemplary processing platform comprises virtual machines (VMs) 702-1, 702-2, . . . 702-L implemented using a hypervisor 704. The hypervisor 704 runs on physical infrastructure 705. The cloud infrastructure 700 further comprises sets of applications 710-1, 710-2, . . . 710-L running on respective ones of the virtual machines 702-1, 702-2, . . . 702-L under the control of the hypervisor 704.

The cloud infrastructure 700 may encompass the entire given system or only portions of that given system, such as one or more of client, servers, controllers, or computing devices in the system.

Although only a single hypervisor 704 is shown in the embodiment of FIG. 7, the system may of course include multiple hypervisors each providing a set of virtual machines using at least one underlying physical machine.

An example of a commercially available hypervisor platform that may be used to implement hypervisor 704 and possibly other portions of the system in one or more embodiments of the invention is the VMware® vSphere™ which may have an associated virtual infrastructure management system, such as the VMware® vCenter™. The underlying physical machines may comprise one or more distributed processing platforms that include storage products, such as VNX™ and Symmetrix VMAX™, both commercially available from EMC Corporation of Hopkinton, Mass. A variety of other storage products may be utilized to implement at least a portion of the system.

In some embodiments, the cloud infrastructure additionally or alternatively comprises a plurality of containers implemented using container host devices. For example, a given container of cloud infrastructure illustratively comprises a Docker container or other type of LXC. The containers may be associated with respective tenants of a multi-tenant environment of the system, although in other embodiments a given tenant can have multiple containers. The containers may be utilized to implement a variety of different types of functionality within the system. For example, containers can be used to implement respective compute nodes or cloud storage nodes of a cloud computing and storage system. The compute nodes or storage nodes may be associated with respective cloud tenants of a multi-tenant environment of system. Containers may be used in combination with other virtualization infrastructure such as virtual machines implemented using a hypervisor.

Figure 8:
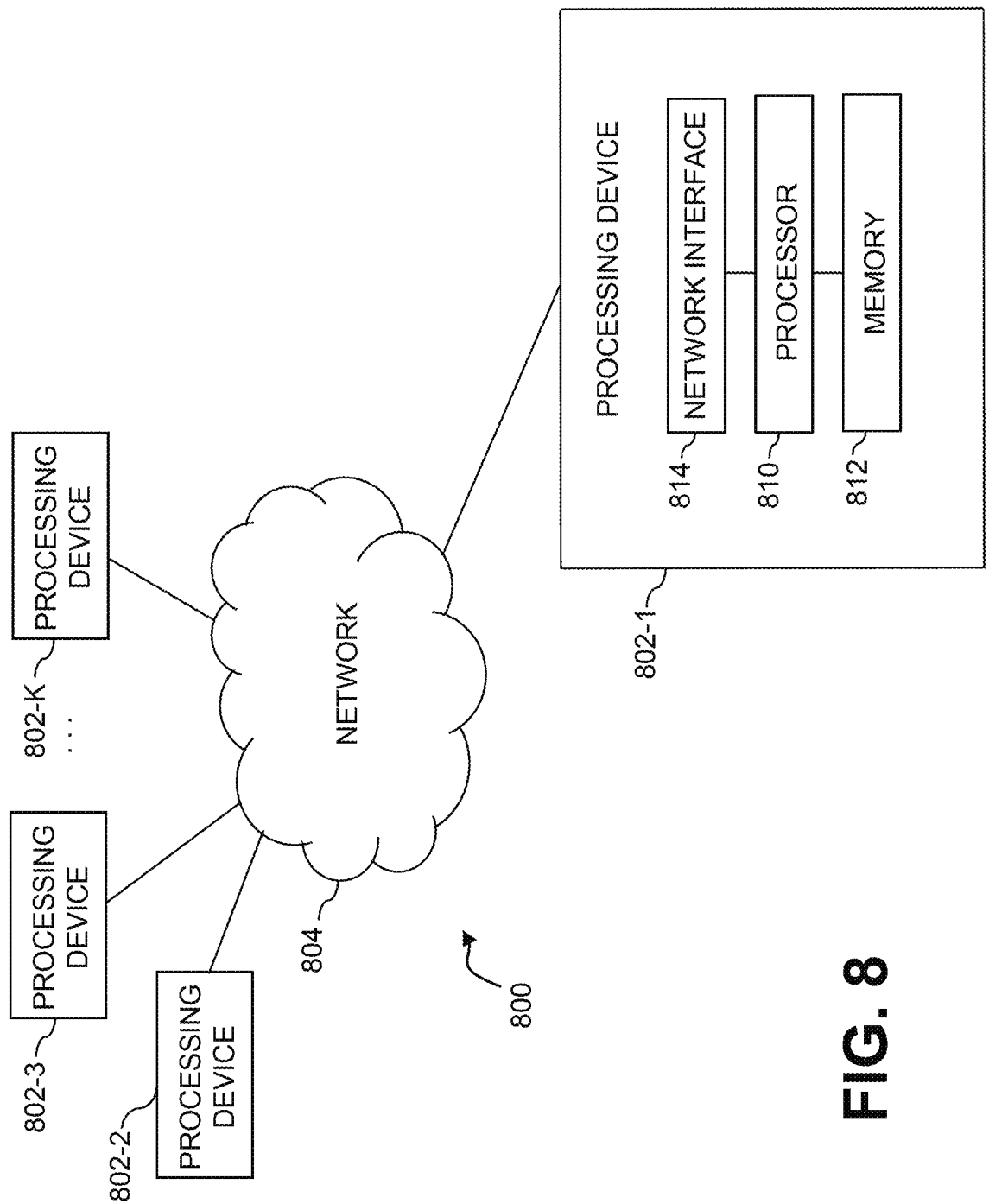
FIG. 8 illustrates another exemplary processing platform that may be used to implement at least a portion of one or more embodiments of the invention.

Another example of a processing platform is processing platform 800 shown in FIG. 8. The processing platform 800 in this embodiment comprises at least a portion of the given system and includes a plurality of processing devices, denoted 802-1, 802-2, 802-3, . . . 802-K, which communicate with one another over a network 804. The network 804 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 802-1 in the processing platform 800 comprises a processor 810 coupled to a memory 812. The processor 810 may comprise a microprocessor, a microcontroller, an application specific integrated circuit (ASIC), a field programmable gate array (FPGA) or other type of processing circuitry, as well as portions or combinations of such circuitry elements, and the memory 812, which may be viewed as an example of a "computer program product" having executable computer program code embodied therein, may comprise random access memory (RAM), read only memory (ROM) or other types of memory, in any combination.

Also included in the processing device 802-1 is network interface circuitry 814, which is used to interface the processing device with the network 804 and other system components, and may comprise conventional transceivers.

The other processing devices 802 of the processing platform 800 are assumed to be configured in a manner similar to that shown for processing device 802-1 in the figure.

Again, the particular processing platform 800 shown in the figure is presented by way of example only, and the given system may include additional or alternative processing platforms, as well as numerous distinct processing platforms in any combination, with each such platform comprising one or more computers, storage devices or other processing devices.

Multiple elements of system may be collectively implemented on a common processing platform of the type shown in FIG. 6 or 8, or each such element may be implemented on a separate processing platform.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

Also, it should again be emphasized that the above-described embodiments of the invention are presented for purposes of illustration only. Many variations and other alternative embodiments may be used. For example, the disclosed techniques for managing execution of a workflow are applicable to a wide variety of other types of communication systems, storage systems and processing devices. Accordingly, the particular illustrative configurations of system and device elements detailed herein can be varied in other embodiments. These and numerous other alternative embodiments within the scope of the appended claims will be readily apparent to those skilled in the art.

What is claimed is:

1. A method for managing execution of a given workflow comprising one or more sub-workflows, comprising:
   parsing and interpreting a definition of said given workflow and said one or more sub-workflows, wherein said given workflow is one of a plurality of workflows that share at least a portion of resources employed by the given workflow;
   flattening said given workflow and said one or more sub-workflows into a directed acyclic graph where nodes represent activities of the given workflow and edges represent partial-order constraints;
   collecting provenance data about one or more executions of said given workflow according to said directed acyclic graph, wherein said collected provenance data comprises a resource allocation of said given workflow comprising an assignment of resources to the activities, input parameters of the activities of the given workflow, output parameters of the activities of the given workflow, telemetry metrics indicating the use of one or more computational resources during the execution of one or more of said activities of the activities of the given workflow and data regarding an execution of additional workflows in the plurality of workflows, wherein the data for the additional workflows comprises one or more features of the additional workflows and an indication of one or more activities of the additional workflows;
   taking one or more snapshots of the collected provenance data as a representation of a state of one or more prior executions of the given workflow, wherein the one or more snapshots comprise a selection of features from said input and output parameters, and said telemetry metrics indicating the use of the one or more computational resources at the time of the snapshot;
   calculating, using at least a portion of the collected provenance data, one or more quality metrics regarding one or more prior executions of the plurality of workflows;
   associating said one or more snapshots to said one or more quality metrics;
   training one or more prediction models of said quality metrics using machine learning techniques based on said one or more snapshots of a plurality of said prior executions of the plurality of workflows; and
   processing said one or more prediction models during a real-time execution of said given workflow to adjust the execution of said given workflow of the plurality of workflows, by updating the input parameters of said activities of the given workflow and the resource allocation of said given workflow, taking into account one or more of said quality metrics for the plurality of workflows predicted by said one or more prediction models,
   wherein the method is performed by at least one processing device comprising a processor coupled to a memory.

2. The method of claim 1, wherein said step of taking one or more snapshots is triggered when a given execution crosses one or more elements of said directed acyclic graph that are marked with a predefined flag.

3. The method of claim 1, wherein said step of taking one or more snapshots is triggered at a specified time interval during a given execution.

4. The method of claim 1, wherein the one or more prediction models are updated substantially continuously as more provenance data about new executions are collected.

5. The method of claim 1, wherein the one or more snapshots included in the step of training one or more prediction models comprise one or more snapshots taken during the one or more executions of said given workflow and one or more additional snapshots generated after a completion of the workflow executions.

6. The method of claim 1, wherein said collected provenance data comprises one or more provenance data resulting from historical executions of the workflow.

7. A computer program product for managing execution of a given workflow comprising one or more sub-workflows, comprising a non-transitory machine-readable storage medium having encoded therein executable code of one or more software programs, wherein the one or more software programs when executed by at least one processing device perform the following steps:
   parsing and interpreting a definition of said given workflow and said one or more sub-workflows, wherein said given workflow is one of a plurality of workflows that share at least a portion of resources employed by the given workflow;
   flattening said given workflow and said one or more sub-workflows into a directed acyclic graph where nodes represent activities of the given workflow and edges represent partial-order constraints;
   collecting provenance data about one or more executions of said given workflow according to said directed acyclic graph, wherein said collected provenance data comprises a resource allocation of said given workflow comprising an assignment of resources to the activities, input parameters of the activities of the given workflow, output parameters of the activities of the given workflow, telemetry metrics indicating the use of one or more computational resources during the execution of one or more of said activities of the activities of the given workflow and data regarding an execution of additional workflows in the plurality of workflows, wherein the data for the additional workflows comprises one or more features of the additional workflows and an indication of one or more activities of the additional workflows;
   taking one or more snapshots of the collected provenance data as a representation of a state of one or more prior executions of the given workflow, wherein the one or more snapshots comprise a selection of features from said input and output parameters, and said telemetry metrics indicating the use of the one or more computational resources at the time of the snapshot;
   calculating, using at least a portion of the collected provenance data, one or more quality metrics regarding one or more prior executions of the plurality of workflows;
   associating said one or more snapshots to said one or more quality metrics;
   training one or more prediction models of said quality metrics using machine learning techniques based on said one or more snapshots of a plurality of said prior executions of the plurality of workflows; and
   processing said one or more prediction models during a real-time execution of said given workflow to adjust the execution of said given workflow of the plurality of workflows, by updating the input parameters of said activities of the given workflow and the resource allocation of said given workflow, taking into account one or more of said quality metrics for the plurality of workflows predicted by said one or more prediction models.

8. The computer program product of claim 7, wherein said step of taking one or more snapshots is triggered by one or more of when a given execution crosses one or more elements of said directed acyclic graph that are marked with a predefined flag and at a specified time interval during a given execution.

9. The computer program product of claim 7, wherein the one or more prediction models are updated substantially continuously as more provenance data about new executions are collected.

10. The computer program product of claim 7, wherein the one or more snapshots included in the step of training one or more prediction models comprise one or more snapshots taken during the one or more executions of said given workflow and one or more additional snapshots generated after a completion of the workflow executions.

11. The computer program product of claim 7, wherein said collected provenance data comprises one or more provenance data resulting from historical executions of the workflow.

12. A system for managing execution of a given workflow comprising one or more sub-workflows, comprising:
a memory; and
at least one processing device, coupled to the memory, operative to implement the following steps:
parsing and interpreting a definition of said given workflow and said one or more sub-workflows, wherein said given workflow is one of a plurality of workflows that share at least a portion of resources employed by the given workflow;
flattening said given workflow and said one or more sub-workflows into a directed acyclic graph where nodes represent activities of the given workflow and edges represent partial-order constraints;
collecting provenance data about one or more executions of said given workflow according to said directed acyclic graph, wherein said collected provenance data comprises a resource allocation of said given workflow comprising an assignment of resources to the activities, input parameters of the activities of the given workflow, output parameters of the activities of the given workflow, telemetry metrics indicating the use of one or more computational resources during the execution of one or more of said activities of the activities of the given workflow and data regarding an execution of additional workflows in the plurality of workflows, wherein the data for the additional workflows comprises one or more features of the additional workflows and an indication of one or more activities of the additional workflows;
taking one or more snapshots of the collected provenance data as a representation of a state of one or more prior executions of the given workflow, wherein the one or more snapshots comprise a selection of features from said input and output parameters, and said telemetry metrics indicating the use of the one or more computational resources at the time of the snapshot;
calculating, using at least a portion of the collected provenance data, one or more quality metrics regarding one or more prior executions of the plurality of workflows;
associating said one or more snapshots to said one or more quality metrics;
training one or more prediction models of said quality metrics using machine learning techniques based on said one or more snapshots of a plurality of said prior executions of the plurality of workflows; and
processing said one or more prediction models during a real-time execution of said given workflow to adjust the execution of said given workflow of the plurality of workflows, by updating the input parameters of said activities of the given workflow and the resource allocation of said given workflow, taking into account one or more of said quality metrics for the plurality of workflows predicted by said one or more prediction models.

13. The system of claim 12, wherein said step of taking one or more snapshots is triggered when a given execution crosses one or more elements of said directed acyclic graph that are marked with a predefined flag.

14. The system of claim 12, wherein said step of taking one or more snapshots is triggered at a specified time interval during a given execution.

15. The system of claim 12, wherein the one or more prediction models are updated substantially continuously as more provenance data about new executions are collected.

16. The system of claim 12, wherein the one or more snapshots included in the step of training one or more prediction models comprise one or more snapshots taken during the one or more executions of said given workflow and one or more additional snapshots generated after a completion of the workflow executions.

17. The system of claim 12, wherein said collected provenance data comprises one or more provenance data resulting from historical executions of the workflow.

18. The method of claim 1, wherein each of the plurality of workflows are executed at a same time.

19. The computer program product of claim 7, wherein each of the plurality of workflows are executed at a same time.

20. The system of claim 12, wherein each of the plurality of workflows are executed at a same time.

* * * * *